(12) United States Patent
Hamilton et al.

(10) Patent No.: US 8,938,655 B2
(45) Date of Patent: Jan. 20, 2015

(54) EXTENDING FLASH MEMORY DATA RETENSION VIA REWRITE REFRESH

(75) Inventors: Darlene G. Hamilton, Lyle, WA (US); Mark W. Randolph, San Jose, CA (US); Don Carlos Darling, San Jose, CA (US); Ron Kornitz, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 1187 days.

(21) Appl. No.: 11/961,772

(22) Filed: Dec. 20, 2007

(65) Prior Publication Data

US 2009/0161466 A1 Jun. 25, 2009

(51) Int. Cl.
*G11C 29/00* (2006.01)
*G11C 7/00* (2006.01)
*G11C 16/34* (2006.01)
*G11C 16/10* (2006.01)

(52) U.S. Cl.
CPC .......... *G11C 16/3418* (2013.01); *G11C 16/10* (2013.01); *G11C 16/3431* (2013.01)
USPC ...... 714/763; 714/752; 714/773; 365/185.01; 365/185.09; 365/222

(58) Field of Classification Search
None
See application file for complete search history.

(56) References Cited

U.S. PATENT DOCUMENTS

| | | | |
|---|---|---|---|
| 5,365,486 A | 11/1994 | Schreck | |
| 5,835,413 A * | 11/1998 | Hurter et al. | 365/185.24 |
| 6,169,691 B1 * | 1/2001 | Pasotti et al. | 365/185.25 |
| 6,751,146 B1 * | 6/2004 | Wang et al. | 365/222 |
| 6,816,409 B2 * | 11/2004 | Tanaka | 365/185.03 |
| 7,325,090 B2 * | 1/2008 | Ronen | 711/106 |
| 7,808,834 B1 * | 10/2010 | Sutardja | 365/185.25 |
| 2002/0021599 A1 * | 2/2002 | Peter | 365/200 |
| 2003/0227794 A1 * | 12/2003 | Earl et al. | 365/158 |
| 2004/0179400 A1 * | 9/2004 | Miwa et al. | 365/185.03 |
| 2005/0243626 A1 * | 11/2005 | Ronen | 365/222 |
| 2007/0136509 A1 * | 6/2007 | Agami | 711/103 |
| 2007/0263454 A1 * | 11/2007 | Cornwell et al. | 365/185.24 |
| 2008/0168215 A1 * | 7/2008 | Jiang et al. | 711/103 |

(Continued)

FOREIGN PATENT DOCUMENTS

| | | |
|---|---|---|
| WO | 9828748 A | 7/1998 |
| WO | 2005106886 A | 11/2005 |

OTHER PUBLICATIONS

International Search Report and Written Opinion dated Mar. 26, 2009 for PCT Application U.S. Appl. No. PCT/US2008/087800, 12 Pages.

*Primary Examiner* — Justin R Knapp
(74) *Attorney, Agent, or Firm* — Amin, Turocy & Watson, LLP

(57) ABSTRACT

Providing for extended data retention of flash memory devices by program state rewrite is disclosed herein. By way of example, a memory cell or group of memory cells can be evaluated to determine a program state of the cell(s). If the cell(s) is in a program state, as opposed to a natural or non-programmed state, a charge level, voltage level and/or the like can be rewritten to a default level associated with the program state, without erasing the cell(s) first. Accordingly, conventional mechanisms for refreshing cell program state that require rewriting and erasing, typically degrading storage capacity of the memory cell, can be avoided. As a result, data stored in flash memory can be refreshed in a manner that mitigates loss of memory integrity, providing substantial benefits over conventional mechanisms that can degrade memory integrity at a relatively high rate.

20 Claims, 11 Drawing Sheets

(56) References Cited

U.S. PATENT DOCUMENTS

| | | | |
|---|---|---|---|
| 2008/0170447 A1* | 7/2008 | Jiang et al. | 365/189.011 |
| 2010/0020604 A1* | 1/2010 | Cornwell et al. | 365/185.03 |
| 2010/0182847 A1* | 7/2010 | Ishii et al. | 365/185.29 |
| 2012/0155174 A1* | 6/2012 | Cornwell et al. | 365/185.09 |

* cited by examiner

EXTENDING FLASH MEMORY DATA RETENSION VIA REWRITE REFRESH

BACKGROUND

Memory devices have a wide variety of uses in modern electronic devices, including devices such as cellular phones, personal computers, laptops, personal digital assistants, camcorders, voice recorders, personal media players, global positioning system units, portable storage drives for such devices, and the like. As memory devices become smaller, less expensive to manufacture, and capable of storing larger amounts of information, they become viable products for larger segments of the current electronic technology. Consequently, as consumer demand and available markets for electronic memory increases, additional memory device technologies are developed to fully leverage capabilities of electronic devices in such markets. Flash memory, for example, is one type of electronic memory media that can store, erase and restore data. Furthermore, flash memory, unlike some types of electronic memory, can retain stored data without exposure to continuous electrical power, and is therefore termed "non-volatile memory". Flash memory has become a popular device for consumer electronics, due in part to a combination of the high density and low cost of erasable programmable read only memory (EPROM) and electrical erasability introduced with electronically erasable programmable read only memory (EEPROM). Consequently, such memory has become a useful and popular mechanism for storing, transporting, sharing and maintaining data.

To further evolve technical capabilities associated with flash memory devices, new technical designs typically attempt to maximize flash memory efficiency. As one example, digital information stored on such devices can decay over time. Particularly, such devices are typically associated with a parameter called data retention, that provides an indication of how long data will be stored once written to a flash memory device. Typical storage life of data in flash memory can be from several years up to 10 years, for example. Some applications, however, can be very sensitive to storage life. As one example, consumers often desire pictures of family and friends to last years, decades, or even longer. Digital representations of those pictures can be subject to data retention decay as discussed above, however. Accordingly, a strong selling point for digital storage devices, like flash memory or similar technology, is data retention length.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Providing for extended data retention of flash memory devices by program state rewrite is disclosed herein. For instance, a memory cell or group of memory cells can be evaluated to determine a program state of the cell(s). If the cell(s) is in a program state, as opposed to a natural, erased or non-programmed state, a charge level, voltage level and/or the like can be re-written to a default level (e.g., as opposed to a drifted level related to data loss) associated with the program state. Accordingly, conventional mechanisms for refreshing cell program state that require a full erase and program cycle, typically degrading storage capacity of the memory cell, can be avoided.

According to one or more other aspects, a cell or group of memory cells can be time stamped when they are programmed. For instance, if a default, erased level of charge stored in a memory cell is changed to a non-default, programmed level of charge, the time when such change is implemented can be recorded. In addition, when the cell(s) is refreshed as described herein or via a conventional refresh mechanism, a refresh time can also be recorded. Further, an automatic reprogram of the cell(s) can be implemented after a threshold time has passed since the programming time (e.g., point in time when the cell was last programmed) and/or most recent refresh time. Consequently, the subject disclosure can provide for periodically refreshing a program state of one or more cells to preserve integrity of stored data and extend its data retention.

In accordance with further aspects, a read error rate associated with a cell or group of cells can be monitored and compared with a threshold. If the read error rate rises above a predetermined threshold value, it can be assumed that the cell(s) is exhibiting charge loss. Accordingly, the program state of such cell(s) can be determined and reprogrammed to an appropriate charge (or, e.g., voltage, or the like) level corresponding to the program state. In such a manner, data stored in the cell(s) can be refreshed while reducing detrimental affects on the cell's ability to store data (e.g., as exhibited by conventional program/erase cycle refresh operations).

According to still other aspects, a cell or group of cells can be evaluated to determine whether they are in a programmed state. A charge or voltage level of a programmed cell(s) can be monitored and compared to a default charge/voltage level associated with the program state. If the charge or voltage level drifts outside of a threshold range of the default charge/voltage level, the cell(s) can be reprogrammed to the default level. By reprogramming without first erasing the cell(s), detrimental effects on the ability of the cell(s) to store and retain data can be reduced. Accordingly, an overall data retention parameter associated with the cell(s) can be enhanced while maintaining integrity of stored data.

According to still other aspects, cell reprogramming can involve injection of electrons or holes to raise or lower a charge, as suitable to a particular flash memory technology. For instance, some technologies involve increasing a charge level of a cell in order to program the cell. Accordingly, such a programmed cell has a higher charge level. Other technologies, on the other hand, involve injecting holes into a memory cell to decrease charge level of the cell. Such cells are considered 'programmed' when in a state represented by a decreased charge level as compared with a natural, or default charge level. Accordingly, the subject innovation can provide for refreshing a program state of a memory cell by injecting electrons or injecting holes, to restore a default charge level associated with the program state. Thus, the subject disclosure provides for extending data retention for various types of flash technology, including various single-bit and multi-bit memory cell technologies, such as MirrorBit® technology, SLC (Single Level Cell) Floating Gate technology, MLC (Multi Level Cell) Floating Gate technology, MirrorBit® Quad technology, MirrorBit® Tribit technology, or like technologies, as well as various flash memory architectures such as a NOR, NAND, AND, ORNAND™, or DDR, or like architecture, or any suitable combination thereof.

To the accomplishment of the foregoing and related ends, the one or more aspects comprise the features hereinafter

DETAILED DESCRIPTION

Figure 1:
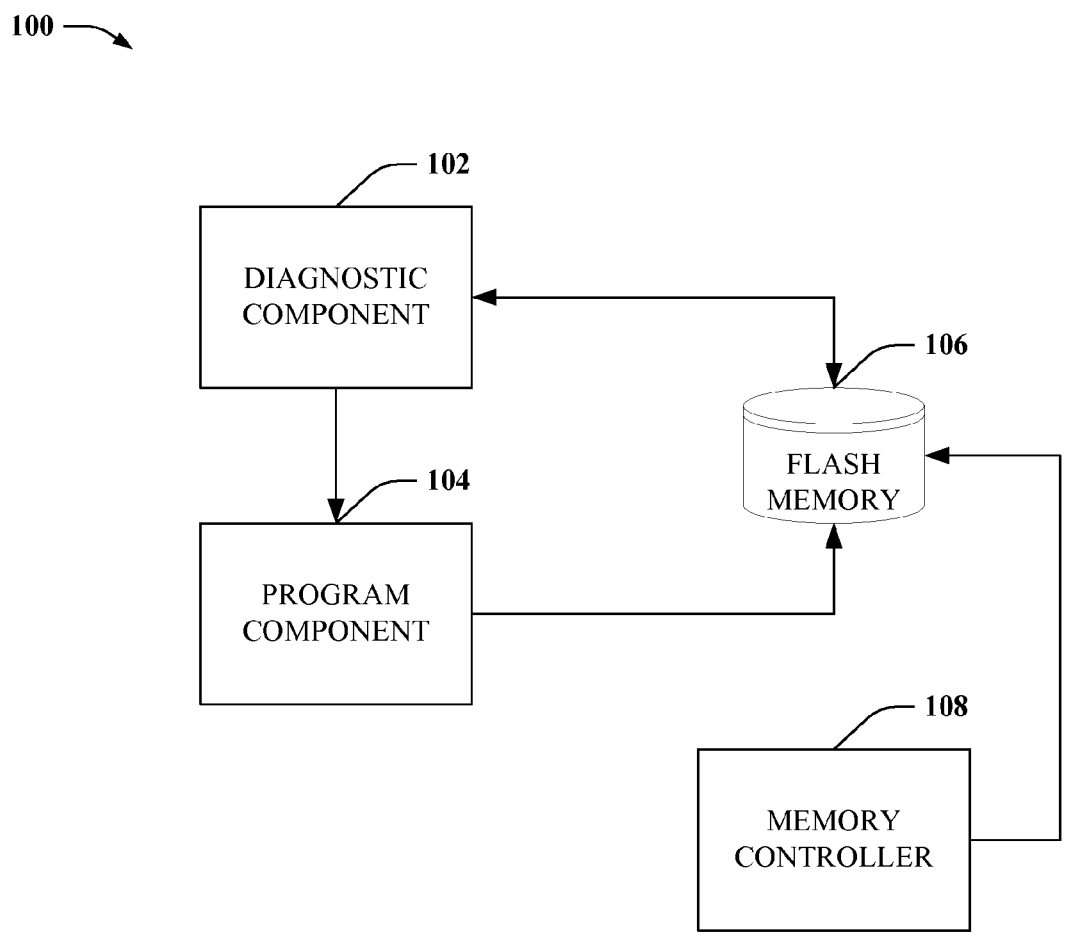
FIG. 1 illustrates a block diagram of a sample system that can provide extended data retention for various types of flash memory.

Various aspects are now described with reference to the drawings, wherein like reference numerals are used to refer to like elements throughout. In the following description, for purposes of explanation, numerous specific details are set forth in order to provide a thorough understanding of one or more aspects. It can be evident, however, that such aspect(s) can be practiced without these specific details. In other instances, well-known structures and devices are shown in block diagram form in order to facilitate describing one or more aspects.

The subject disclosure provides a mechanism to increase data retention for flash-type memory devices by refreshing stored data through a reprogram operation. Typical memory cells and/or memory cell controllers can re-record data in a memory cell to counteract the effects of charge loss or charge gain, depending on a convention adopted by a particular flash technology. According to conventional mechanisms, re-recording stored data typically involves reading the data, storing data in temporary cells, erasing blocks of memory cells and then re-writing formerly programmed cells to return the charge level of such cells to a predetermined program state (see below). However, such program/erase cycles can degrade memory cells and render them unstable, in effect reducing the ability of such cells to store data. To address this problem, the subject disclosure provides for refreshing stored data by reprogramming (or selective reprogramming only cells that lost charge) without erasing, as described in more detail herein.

Typical flash-type memory (e.g., NOR, NAND, AND, ORNAND™, or the like) can suffer from data loss over time. Data is stored as a digital bit or digital bits within a memory cell. A cell typically includes one or more transistor-type devices that can hold electric charge, and/or accommodate flow of current. A un-programmed operating level (e.g., a native voltage threshold level, native charge level, native current level, and so on) for the memory cell can involve a particular level of charge, voltage, and/or current. This un-programmed operating level can typically be associated with a first state, e.g., a 1, of a digital bit or group of bits. Memory cells can also be programmed (e.g., injected with charge, current, voltage, and so on) to another level of charge/voltage/current, distinguishable from erase or un-programmed operating level, to form a second character of the digital bit or group of bits, e.g., a 0. Although different program state conventions can exist for varying flash memory technologies, an erase level (e.g., 1) can correspond to an un-programmed state and a different level (e.g., 0 associated with a higher or lower charge/voltage/current level than the un-programmed operating level) can correspond to a programmed state.

Although the foregoing introduces only single-bit memory cells, data retention for other multi-bit memory cell architectures can be increased according to the various embodiments disclosed herein. For instance, dual-bit, tri-bit, quad-bit, etc., multi-bit memory cell devices can be included within the term memory cell as utilized herein. As an example, at least one type of quad-bit memory cell architecture (e.g., MirrorBit® quad flash) can accommodate four different and electrically distinct levels of charge, voltage and/or current in each half cell. Specifically, a first level of charge can be a typical amount of charge stored in a memory cell at an un-programmed operating level, which can correspond to a non-programmed state. A second level of charge, distinguishably higher than the first level (e.g., by typical mechanisms for measuring an amount of electric charge), can correspond to a first program state. A third level of charge, distinguishably higher than the second level, can correspond to a second program state, and a fourth level of charge, distinguishably higher than the third level, can correspond to a third program state. Each program state can be refreshed and returned to a predetermined charge level associated with the program state(s), as described herein. Accordingly, the subject specification can provide enhanced data retention and increased endurance (e.g., increasing a number of program/erase cycles prior to significant memory degradation) for any suitable flash technology in conjunction with a refresh mechanism as described herein.

To provide a further illustration of the foregoing, programming a flash memory cell typically involves changing a nominal charge/voltage and/or current level (hereinafter referred to as a cell level) associated with an erase state to a non-nominal level, or non-nominal levels in a multi-bit cell technology, associated with a program state. The non-nominal level(s) can correspond to a predetermined amount of charge/voltage and/or current below a default cell level. A concurrent cell level of a memory cell can therefore correspond to one or more program states (e.g., non-default cell level) or a non-programmed state (e.g., a default or nominal state, a natural state or erased state, or like terminology).

In order to store data within a memory cell chip, a cell level of various memory cells and/or groups of memory cells is systematically set (e.g., programmed or erased) in order to store information using binary bits or groups of binary bits. To change the program state of a memory cell or group of memory cells (e.g., a block of cells, or page of cells, and so on) the cells are first erased, and then selected cells are programmed. Erasure can involve increasing cell level (e.g., injecting electrons, increasing voltage, and/or increasing current flow, and so on) or decreasing cell level (e.g., injecting holes, decreasing voltage, and/or decreasing current flow, etc.) depending on the flash technology and the convention utilized to define a program state(s) and un-programmed state. For instance, erasure of programmed cells in which a natural operating level has a lower charge/voltage/current than a programmed level involves decreasing the cell level from the programmed level to the natural operating level. On the other hand, erasure of programmed cells in which a natural operating level has a higher charge/voltage/current than a programmed level involves increasing the cell level from the programmed level to the natural operating level, and so on.

One common property of flash-type memory cells is that they can retain a charge level, whether default or programmed, for a relatively long time. For instance, it is typical for a flash memory cell to retain a program or non-program cell state (e.g., corresponding to one of two or more electrically distinguishable current/charge/voltage levels) for years, decades, or longer. However, there are limits to such data retention. Over time, a cell program level can degrade. For instance, a memory cell can slowly lose stored charge over time. As a result, distinction between program and un-programmed states, as well as distinction between multiple program states, can diminish over time resulting in memory read errors (e.g., where two cell levels overlap and render two or more binary words indistinguishable from each other) and/or lost data.

To counteract problems associated with data loss, memory cells can be refreshed such that a default charge corresponding to a particular program state (e.g., 5 units of charge) can be renewed at the memory cell if the charge drops below the default level (e.g., 3 units of charge). Refreshing the charge level of a memory cell can extend the 'life' of data stored within the memory cell, by returning it to a distinguishable value associated with the particular program state. As mentioned previously, typical mechanisms for refreshing charge first copy stored data into alternate memory, such as random access memory (RAM), erase groups of memory cells (e.g., blocks or pages), and then rewrite the data stored in RAM to the memory cells. This procedure constitutes one program/erase cycle. Unfortunately, however, the program/erase cycle is detrimental to a memory cell's ability to maintain a cell level and prevent cell level loss. Thus, although a program/erase refresh operation can restore data in the memory cell, it can also make the memory cell unstable and reduce its ability to preserve that data.

The subject innovation therefore provides for refreshing data via reprogramming data cells instead of re-recording stored data utilizing a full program/erase cycle. Accordingly, the detrimental effects that a program/erase cycle has on a memory cell's capacity to preserve binary data, due in greater part to the erase operation than the program operation, can be drastically reduced. For instance, increase in memory cell data retention of 10% can be achieved, and much greater data retention, 100% or much more, can be possible. In addition, refreshing the data as disclosed herein is much faster than re-recording the data because an erase operation is not required. In addition to the foregoing, a status of each cell can be checked prior to refreshing, and cells can be selectively refreshed only if a concurrent program level of such cells drop outside a threshold range of a default level associated with a programmed state. Accordingly, extraneous programming and erasing can be avoided.

The reprogram refresh operation described herein can be conducted periodically, every day, week, month, or the like. In addition, a number of reprogram refresh operations performed after programming a cell can be capped (e.g., at 1 operation, 2 operations, 5 operations, etc.) The cap can be set at a number of refresh operations expected to give substantially optimal data retention results. Alternatively, or in addition, the reprogram refresh operation can be conducted when memory cell levels corresponding to a particular program state drop below a default level by a threshold amount. For instance, if a program state has a default level of charge of five units, a threshold could be +/− one unit (or, e.g., +/− two units, and so on). Accordingly, if charge level of such memory cell drops below four units, the cell could be refreshed. According to other embodiments, a reprogram refresh operation can be conducted as a function of read errors for a memory cell or group of memory cells. Specifically, if a number or frequency of read errors rises above a threshold level (e.g., 1 bit error per 512 Bytes read, etc.), the re-fresh can be triggered for the cell or group of cells, as suitable. Furthermore, a reprogram refresh operation can be conducted if a combination of the foregoing occur. As a particular example, if a threshold time passes since a time of programming, a cell can be measured to determine a current cell level. If such cell level drops below a threshold range associated with a programmed state, the cell can then be refreshed as described herein. Additionally, if a threshold number of read errors pertaining to one or more cells occur, the cell level of such cells can be measured and compared to the threshold range, and can be refreshed if needed ("selective refresh"). In addition to the foregoing, the various mechanisms for triggering refresh can be implemented independently, in conjunction with each other, or with one or more other mechanisms known in the art, as logically suitable.

In addition to the foregoing, a substantial benefit is provided over conventional mechanisms that perform a full reprogram/erase operation to refresh data. Conventional mechanisms for improving flash memory data retention relied on optimizing memory cell architecture (e.g., physical changes to the structure, composition, orientation, electrical supply power, or the like or a combination thereof, of memory cell material layers during a design phase of flash memory cells). Attempts to improve data retention post design were not conducted, partly because of assumptions that memory cell integrity was a physical phenomenon affected most significantly by architecture design. The subject disclosure, however, provides a post-design mechanism to improve data retention and permitted program/erase cycles for flash memory, and thus is applicable not only to newly designed flash memory but to existing flash memory by adding the refresh functionality, providing a substantial benefit to the properties of such devices. In addition to the foregoing, data retention of 10% or more for various flash memories is achievable; moreover, it is believed that data retention of 100% or much more in certain circumstances (e.g., for some flash memory architecture under suitable operating conditions, such as temperature, supply power, etc.) can be achieved. As a result, the benefits to data retention are unexpectedly high, as typical improvements resulting from memory cell architecture changes (e.g., during flash memory design phase) are incremental at best (e.g., a few percent or less).

Various aspects of the disclosure are described below. It should be apparent that the teaching herein can be embodied in a wide variety of forms and that any specific structure and/or function disclosed herein is merely representative. Based on the teachings herein one skilled in the art should appreciate that an aspect disclosed herein can be implemented independently of other aspects and that two or more of these aspects can be combined in various ways. For example, a system can be implemented and/or a method practiced using any number of the aspects set forth herein. In addition, a system can be implemented and/or a method practiced using other structure and/or functionality in addition to or other than one or more of the aspects set forth herein. As an example, many of the methods, devices, and systems described herein are described in the context of refreshing flash memory cells by way of a reprogram operation and various embodiments for controlling the operation(s) and/or triggering the operation(s). One skilled in the art should appreciate that similar techniques could apply to other computer and/or storage environments as well.

As used in this disclosure, the terms "component," "system," and the like are intended to refer to a computer-related entity, either hardware, software, software in execution, firmware, middle ware, microcode, and/or any combination thereof. For example, a component can be, but is not limited to being, a process running on a processor, a processor, an object, an executable, a thread of execution, a program, and/or a computer. One or more components can reside within a process and/or thread of execution and a component can be localized on one computer and/or distributed between two or more computers. Further, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal). Additionally, components of systems described herein can be rearranged and/or complemented by additional components in order to facilitate achieving the various aspects, goals, advantages, etc., described with regard thereto, and are not limited to the precise configurations set forth in a given figure, as will be appreciated by one skilled in the art.

Additionally, the various illustrative logics, logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration. Additionally, at least one processor can comprise one or more modules operable to perform one or more of the steps and/or actions described herein.

Moreover, various aspects or features described herein can be implemented as a method, system, or article of manufacture using standard programming and/or engineering techniques. Further, the steps and/or actions of a method or algorithm described in connection with the aspects disclosed herein can be embodied directly in hardware, in a software module executed by a processor, or in a combination of the two. Additionally, in some aspects, the steps and/or actions of a method or algorithm can reside as at least one or any combination or set of codes and/or instructions on a machine readable medium and/or computer readable medium, which can be incorporated into a computer program product. Further, the term "article of manufacture" as used herein is intended to encompass a computer program accessible from any computer-readable device, conductive carrier interface, or media. For example, computer-readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

In addition to the foregoing, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, in this example, X could employ A, or X could employ B, or X could employ both A and B, and thus the statement "X employs A or B" is satisfied under any of the foregoing instances. In addition, the articles "a" and "an" as used in this application and the appended claims should generally be construed to mean "one or more" unless specified otherwise or clear from context to be directed to a singular form.

Referring to FIG. 1, a block diagram of an example system 100 is depicted that provides extended data retention for one or more flash-type memory cells (106) according to one or more aspects of the claimed subject matter. A diagnostic component 102 can determine a program state of one or more cells of the flash memory 106. For instance, diagnostic component 102 can monitor and/or measure a cell level (e.g., level of charge, voltage, current, or the like) associated with a cell or groups of cells (e.g., a page of memory cells) and compare the measured cell level(s) to default levels associated with one or more programmed states. As a more particular example, flash memory 106 is a single bit flash device with memory cells either in a non-programmed state (e.g., binary 1 state) or a programmed state (e.g., binary '0' state). A memory cell(s) in a non-programmed state has a default one unit of charge, and such memory cell(s) in a programmed state has five units of charge. Accordingly, diagnostic component 102 can measure a concurrent level of charge for such cell(s), compare the measured level of charge to the default levels, and determine a state (e.g., programmed or non-programmed) of such cell(s). Diagnostic component 102 can provide program component 104 with an address of cells in a program state, or an address of cells in a non-program state, or both.

Program component 104 can rewrite at least one cell to a predetermined value associated with a particular program state. For instance, program component 104 can refresh cells identified as being in a program state by diagnostic component 102. Refreshing the cells can consist of simply reprogramming them to a default cell level that corresponds with the program state. To continue the foregoing example, program component 104 can receive an address of a cell(s) (e.g., to identify a particular cell or group of cells) from the diagnostic component 102 identified as a programmed cell(s). Program component 104 can thus refresh the programmed cell(s) by setting the charge (or, e.g., voltage, current or the like) to five units, the default cell level corresponding to the program state. Accordingly, if such cell(s) had begun to lose charge and drift toward the non-programmed state (e.g., if charge of such cells had dropped to four units, three units, or two units), setting the charge to five units can render such cell(s) easily distinguishable from the non-program state, and effectively reprogrammed.

It should be understood that the foregoing refresh procedure provides a significant benefit over conventional refresh mechanisms. Typically, conventional systems first erase programmed cells and then re-program them to a default cell level. Typically, data must be temporarily stored in RAM to preserve the data while the flash memory cells are erased. Storing, erasing, and reprogramming requires significantly more power than reprogramming without storing in RAM and without erasing. In addition to the foregoing, a full erase/program cycle degrades memory cell integrity, rendering such memory cell(s) less capable of maintaining cell levels (and, e.g., more susceptible to cell level loss), decreasing long-term data retention. Further, a disproportionate amount of such degradation results from the erase operation rather than the program operation. Accordingly, the subject disclosure can provided for substantial preservation of memory cell integrity while refreshing data within such cell(s). The cell(s) can store data for longer periods of time as a result. Moreover, reprogramming can increase a number of program/erase cycles resulting from normal manipulation of digital data on flash memory (e.g., writing and/or erasing involved in changing stored data, moving data from one portion of flash memory to another portion, adding data, deleting data, and so on). Consequently, the subject innovation can provide for longer life flash memory by substantially limiting a number of erase/program cycles performed on such flash memory.

System 100 can also include a memory controller 108 that provides typical addressing, identification, and data manipulation functions for flash memory 106. It should be appreciated that, although diagnostic component 102 and program component 104 are depicted as separate from flash memory 106 and memory controller 108, such components 102, 104 can reside proximate groups of flash memory cells (106), proximate memory controller 108, proximate a flash memory module (not depicted), or a combination thereof, or separate from such entities. Accordingly, system 100 (and other systems and methods of the subject disclosure) should not be interpreted as limited by the pictorial arrangements of components 102, 104, 106, 108 as displayed in the associated figure(s). It should also be appreciated that flash memory 106 can include multiple flash memory technologies including MirrorBit®, floating-gate, MirrorBit® quad, MirrorBit® tribit, or like technology, as well as multiple flash architectures and/or interfaces such as NOR, NAND, AND, ORNAND™, DDR, and so on.

According to further embodiments, memory controller 108 can be an internal controller integrated in the flash memory device, or serve as an external controller (e.g., external to the flash memory device 106) that can interface with the flash memory 106. In such capacity, memory controller 108 can instruct the flash memory 106 to perform a rewrite operation with respect to one or more cells (106) in order to refresh program states of such cells. Further, memory control 108 can instruct flash memory 106 to measure a concurrent value of one or more cells, determine a read error rate/frequency, or check for a time stamp, as discussed herein, and/or measure a combination thereof and then perform refresh or selective refresh to cells that lost charge. Further, memory controller 108 can instruct flash memory 106 to report information pertinent to such cells to the memory controller 108, such as read error rate/frequency, measured cell levels, an elapsed time since a prior program or rewrite operation, a status of a rewrite instruction, or a combination of these or like operations.

Figure 2:
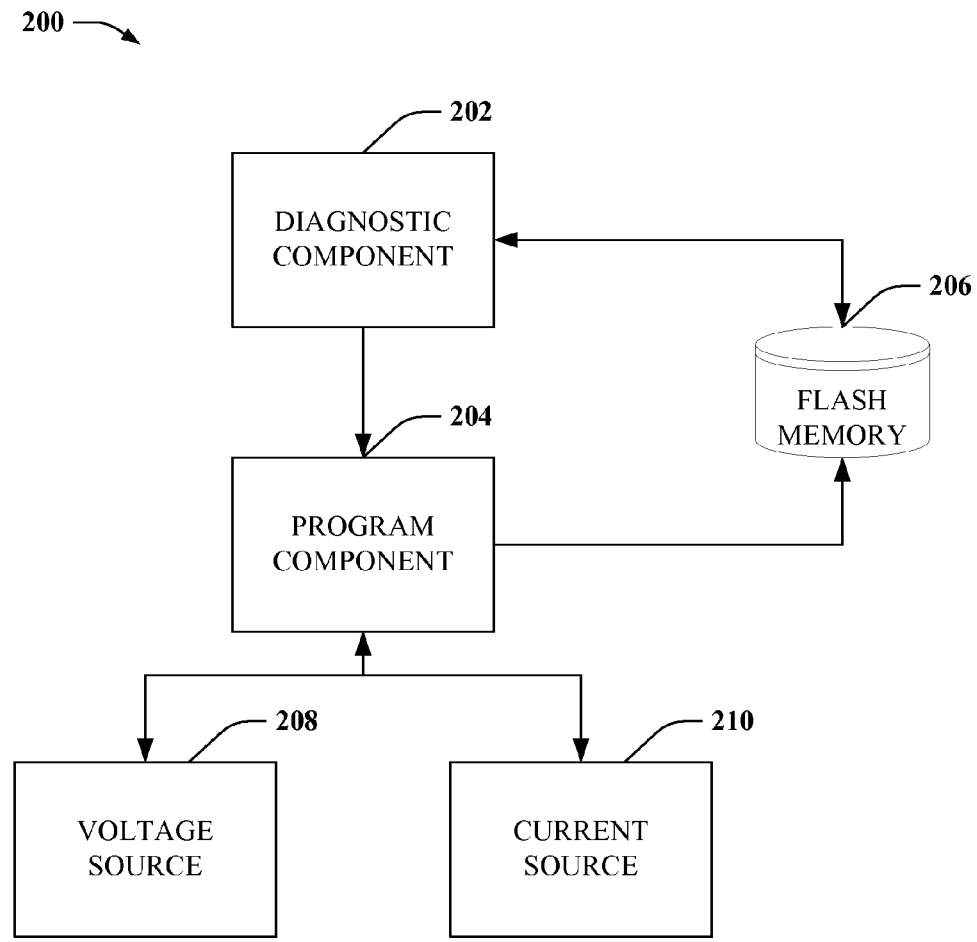
FIG. 2 depicts a block diagram of an example system that can provide extended data retention for various types of flash memory architectures.

FIG. 2 depicts a block diagram of a sample system 200 that can refresh flash memory cells via reprogramming according to additional aspects of the claimed subject matter. System 200 can include a diagnostic component that determines a program state of flash memory 206 cells, and a program component 204 that refreshes the program state(s) of programmed cells by setting a charge level of such cells substantially equal to a default charge level (or levels for multi-level devices) associated with the program state(s). In addition, setting the charge level to the default charge level can be done without erasing the programmed cells. Conventionally, no mechanism existed to increase memory cell endurance (e.g., data retention time and/or a number of program/erase cycles) after such cells are designed and manufactured. Accordingly, system 200 can increase data retention for virtually any suitable flash memory device, if a refresh mechanism, as described herein, is implemented.

System 200 can also include a voltage source 208 and current source 210. Depending on an architecture of the flash memory 206, a cell program level corresponding to a program state (e.g., un-programmed, programmed, first program state, second program state, and so on) can be established by storing charge in cells of the flash memory 206. Accordingly, voltage source 208 can set a cell(s) of the flash memory 206 to a predetermined voltage value (e.g., five volts, etc.) associated with a program state to effect rewriting/refreshing the program state of the cell(s). Alternatively, or in addition, current source 210 can set the cell(s) of the flash memory 206 to a predetermined charge or current value (e.g., five micro-coulombs, 100 electrons, or five milliamps) associated with the program state to effect rewriting/refreshing the program state of the cell(s). Thus, system 200 can accommodate various flash memory technologies that utilize different conventions for establishing a program state (e.g., relative voltage level, relative charge level, and so on).

Figure 3:
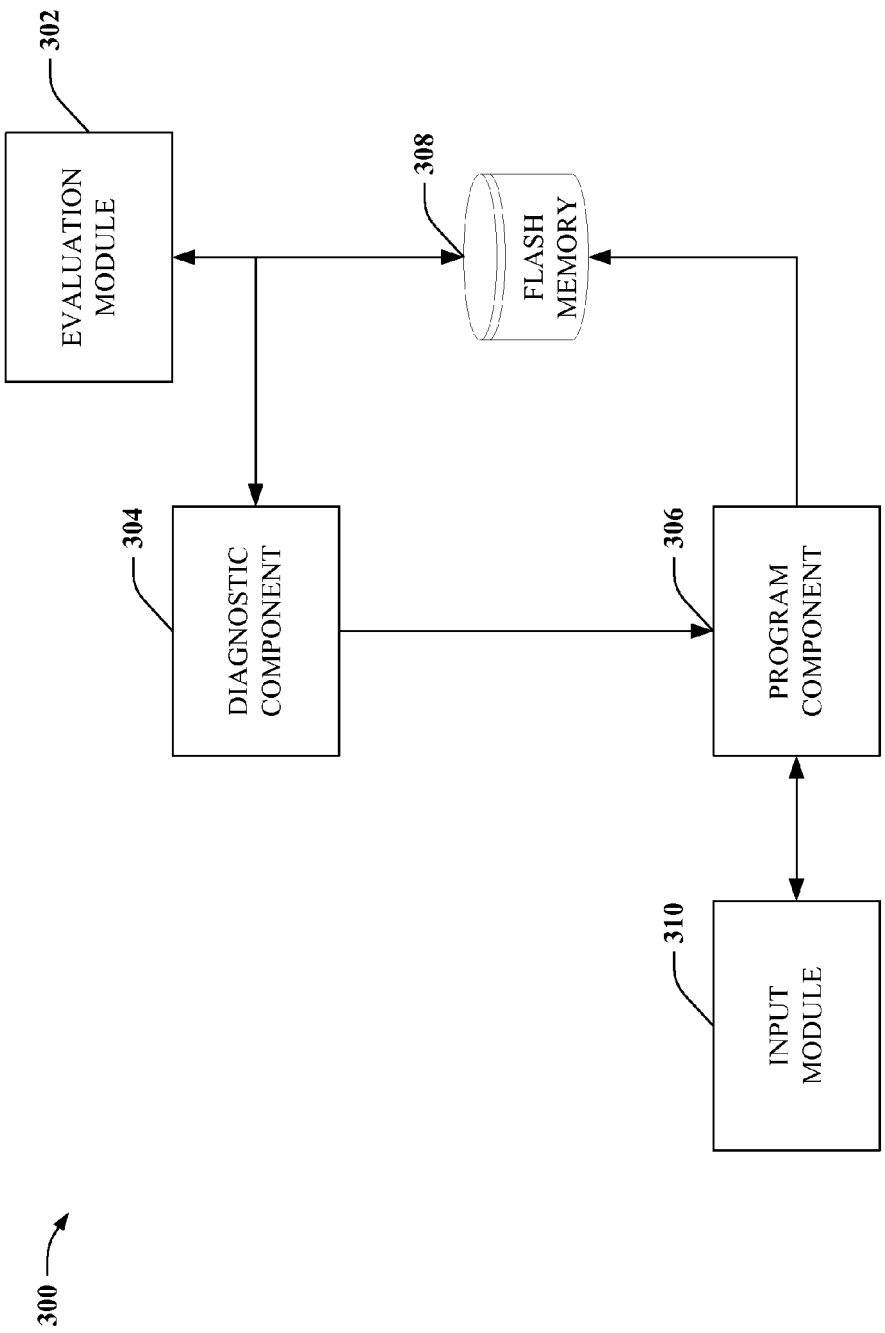
FIG. 3 illustrates a block diagram of a sample system that can evaluate a state of memory cells and refresh the cells according to the evaluated state.

FIG. 3 illustrates a block diagram of a sample system 300 that can evaluate a contemporaneous state of memory cells (306) and refresh the cells (306) according to the evaluated state. Particularly, if a cell(s) level varies from a default level associated with a program state by a threshold amount, the cells can be refreshed as described herein (e.g., see FIGS. 1 and 2, supra). Accordingly, system 300 can measure and/or monitor contemporaneous cell levels of a flash memory device (306) and refresh memory cells exhibiting characteristics of data loss to mitigate actual data loss.

System 300 can include an evaluation module 302 that can determine a concurrent value (e.g., charge, current and/or voltage) of at least one memory cell of flash memory 306 and compare the concurrent value with a default value associated with one or more program states. For instance, if a memory cell has two states, a first that corresponds to a cell level of one volt (e.g., non-programmed state) and a second that corresponds to a cell level of five volts (e.g., programmed state), then a concurrent cell level determined to be 5 volts is in the second state. As long as the concurrent cell voltage can be measurably distinguished from the first state, the memory cell can be considered to be in the second, programmed state and the data or portion thereof represented by such state can be considered intact. However, if voltage loss begins to occur, and the concurrent cell level begins to drift from five volts toward one volt, the first and second states can become indistinct, and the data or portion thereof represented by such distinction can be lost.

Diagnostic component 304 can receive the concurrent cell levels determined by the evaluation module and can further compare such levels to a default level associated with one or more program states and a threshold range(s) thereof. To continue the previous example, if a determined cell level is four volts, it can be assumed that a memory cell having such cell level is in the second state, but that some charge loss has occurred. If a charge loss resulting in cell level of one volt is outside of a threshold permissible charge loss (e.g., 10% charge loss, or the like), then an address of such memory cell (or, e.g., a page of memory cells that includes such memory cell) can be forwarded from diagnostic component 304 to program component 306 so the memory cell can be refreshed.

Program component 306 can rewrite a cell value to a memory cell or group of memory cells if a concurrent value of such cells, as determined by the evaluation module 302 and diagnostic component 304, is outside a threshold range of a default value associated with a program state. Program component 306 can receive addresses of such cell(s) from diagnostic component 304. Further, according to particular embodiments, program component 306 can also receive the state (e.g., non-program state, first program state second program state, and so on) such cell(s) are to be associated with, for instance a non-program state, a first program state, a second program state, etc., depending on the architecture of the flash memory 308 (e.g., single-bit, multi-bit, and so on). Once an address and/or program state are received, program component 304 can set the cell level of a memory cell or group of cells to a predetermined value associated with the program state. As a specific example, setting the cell level can involve programming/writing the cell to the default level, without erasing the cell. Accordingly, system 300 can monitor cell levels and refresh cells that fall outside of a threshold range of a default cell level, in a manner that preserves memory cell integrity and increases data retention as compared with conventional program/erase cycling techniques.

According to additional embodiments, system 300 can condition refreshing and/or initiate refreshing upon receipt of a refresh-type command from an external entity (310). System 300 can include an input module 310 that receives a command to rewrite/reprogram, etc., one or more memory cells of the flash memory 306. System 300 can condition all refresh operations on receipt of such command (e.g., in addition to other requirements such as comparison of concurrent and default cell levels as described above or other requirements described infra), or can enable refresh based on receipt of such command as an exception to other requirements, or a combination of both. Input module 310 can be an interface to a memory cell control module (e.g., see memory controller 108 at FIG. 1, supra), a user-interface providing user controlled refresh and/or conditioning refresh on user approval, or the like. It should also be appreciated that, according to some embodiments, conditioning refresh on receipt of a refresh/rewrite command can be suspended by system 300. Accordingly, system 300 can operate in an 'automatic' mode, where refresh is conducted based on factors related to flash memory 308, a 'control-assisted' mode where refresh is based on a factor related to flash memory 308 in conjunction with a refresh command from input component 310, or based solely on receipt of the refresh command (e.g., 'command-triggered' mode).

Figure 4:
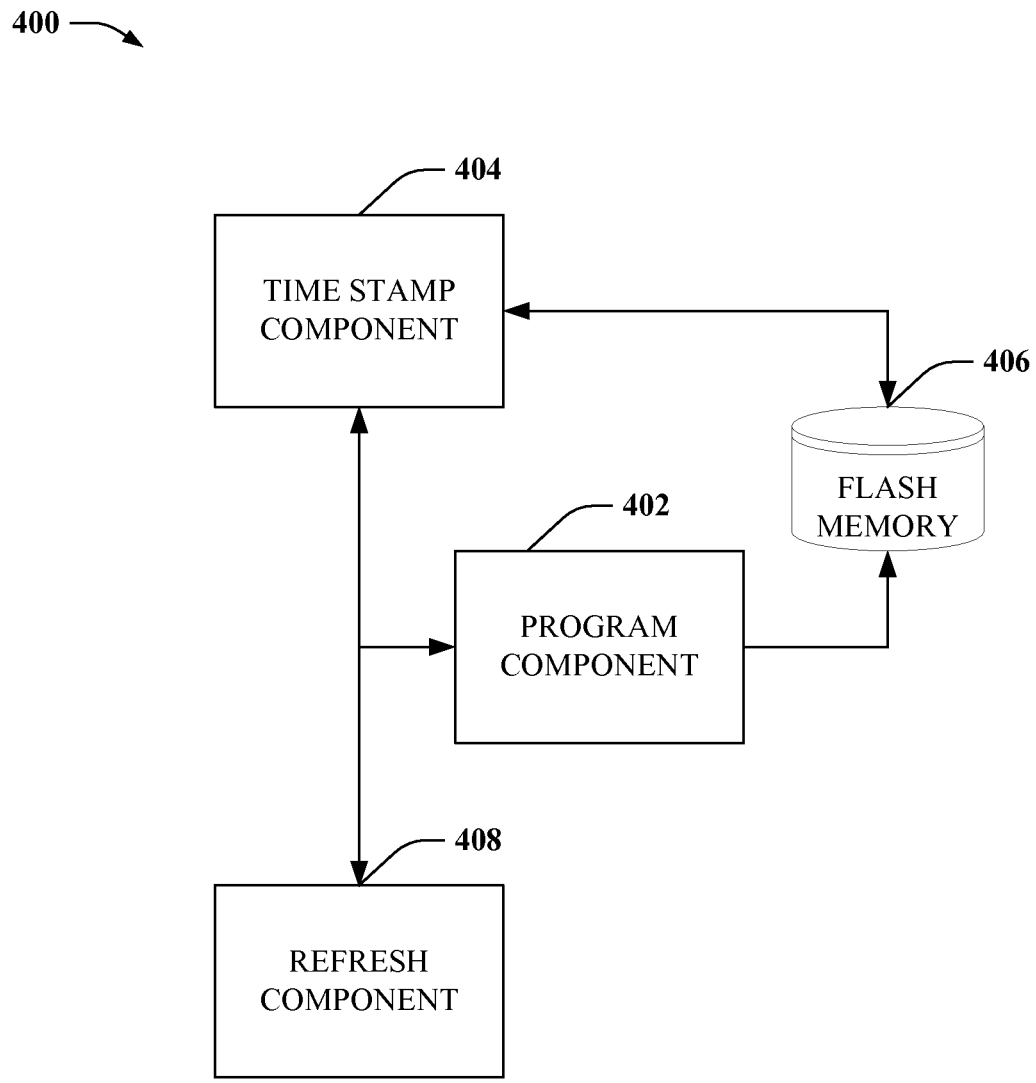
FIG. 4 illustrates a block diagram of an example system that can automatically refresh program states of memory cells as a function of time of programming.

FIG. 4 illustrates a block diagram of an example system 400 that can automatically refresh program states of memory cells (406) as a function of time elapsed since prior programming of such cells (406). For example, system 400 can determine cells of a flash memory device (406) that are in a programmed state as well as an amount of time that has elapsed since a previous program operation. If the amount of elapsed time is above a threshold time for a cell or group of cells, such cell(s) can be refreshed as described herein. Accordingly, system 400 can automatically refresh cells as time elapses to counteract the charge/voltage loss that can typically occur over time.

System 400 can include a program component 402 that can set (e.g., program/write, and so on) memory cells of flash memory 406 to distinct cell levels in order to represent digital information within the flash memory 406. Further, a time stamp component 402 can record a time when one or more cells of flash memory 406 are programmed by program component 402, and associate such time with an address of the programmed cell(s). Such time can be updated if the cell(s) are subsequently programmed or reprogrammed/refreshed, and the updated time can also be associated with the address of the programmed cell(s). Thus, a record of program and refresh events and associated times can be maintained by system 400.

System 400 can also include a refresh component 408 that determines an elapsed time associated with one or more memory cells. For instance, the elapsed time can be determined by comparing a concurrent time to a prior time of programming associated with the memory cell(s) recorded by time stamp component 404. Additionally, if the elapsed time rises above a predetermined refresh time (e.g., a minute, an hour, a day, a week, a month, etc.), refresh component 408 can issue a rewrite command (including, e.g., an address of the cell(s), a desired program state, and/or a default cell level of the desired program state, and so on) to the program component 402. The rewrite command can cause the program component 402 to refresh the at least one cell, for instance, by setting a cell level of such cell(s) to a default cell level associated with a program state. Accordingly, system 400 can monitor elapsed time since previous programming of the memory cells and/or time since last refresh of such memory cells upon expiration of a predetermined refresh time.

According to further embodiments, the predetermined refresh time can be established and/or modified based on use frequency and/or use history associated with the flash memory 406. As a specific example, determined cell charge loss rate, cell reprogram frequency and/or history, read/access frequency/history, or the like, or a combination thereof, can be factors to determine a suitable refresh time and/or adjust such refresh time in order to provide better integrity for stored data. Accordingly, system 400 can automatically refresh flash memory cells (406) or groups of cells (406), as described herein, depending on an elapsed program/refresh time in conjunction with contemporaneous parameters that can affect stability of the memory cells.

Figure 5:
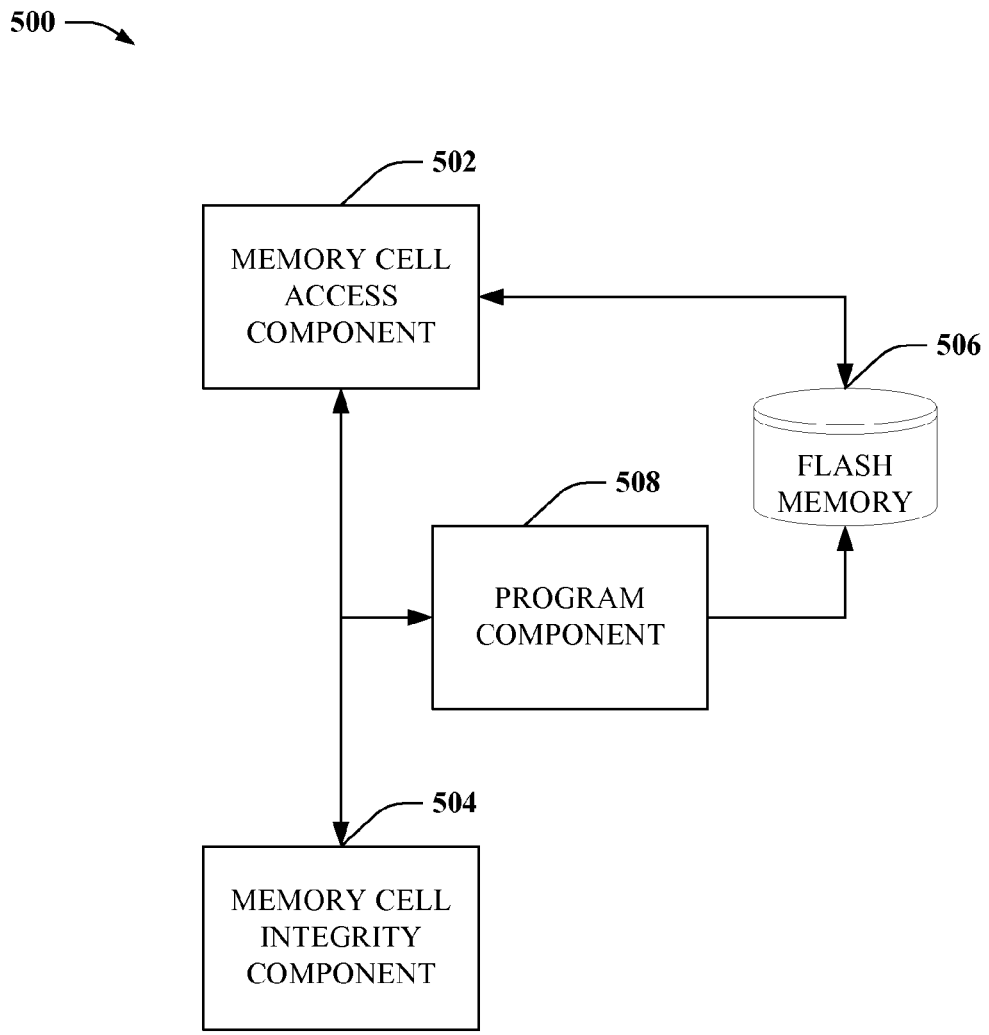
FIG. 5 depicts a block diagram of a sample system that can evaluate read errors for a memory cell(s) and automatically refresh such cell(s) accordingly.

FIG. 5 depicts a block diagram of a sample system 500 that can evaluate read errors for a memory cell(s) and automatically refresh such cell(s) accordingly. System 500 can determine a number of read errors associated with the memory cell(s) over a period of time, or number of read errors in a group of cells read, and, if the number of read errors rises above a threshold number and/or frequency, the memory cell(s) can be reprogrammed in order to refresh data stored in such cell(s). Accordingly, system 500 provides a mechanism to refresh data as a function of potential data loss.

System 500 can include a memory cell access component 502 that can track a number and/or frequency of read errors associated with reading data stored within one or more memory cells of the flash memory 506. A read error can result, for instance, if an attempt to determine whether a cell is in an un-programmed state or a programmed state returns in incorrect result. Said differently, if a concurrent cell level (e.g., amount of voltage, charge, and/or current) is read as an un-programmed state (e.g., a 1 bit) when it should be read as a programmed state (e.g., a 0 bit), or vice versa, a read error results. In a multi-level flash memory, a read error occurs when reading a program level of a cell that was erased or programmed to a different level. Accordingly, memory cell access component 502 can include an error detection mechanism that identifies a number and/or frequency of read errors. The error detection mechanism can compare the number or frequency to a predefined threshold. Such read errors, for example, could be reading '1' (un-programmed state) that should have been '0' (programmed state).

A number and/or frequency of read errors determined by the error detection mechanism in memory cell access component 502 can be provided to a memory cell integrity component 504. The memory cell integrity component 504 can compare the number/frequency of read errors with a predetermined threshold level. If the number/frequency rises above the threshold level, memory cell integrity component 504 can issue a rewrite command to a program component 508. Such rewrite command can cause the program component to refresh the cell(s), as described herein, associated with the read error(s). More specifically, the rewrite command can include an address of such memory cell(s) and an expected program state(s) and/or default cell level(s) (e.g., for a multi-bit flash memory architecture, a particular cell level for each memory cell/group of cells and program state can be provided) associated with the expected program state(s). Program component 508 can then identify the particular cell(s) and set an associated cell level to match a predetermined level associated with a program state/cell level specified in the rewrite command. Accordingly, by setting cell levels directly to the predetermined cell level(s), memory cell refresh can be performed without erasing such cells, thereby preserving cell integrity, increasing data retention, and increasing a typical number of program/erase cycles associated with such cells, as compared with conventional techniques.

The aforementioned systems have been described with respect to interaction between several components. It should be appreciated that such systems and components can include those components or sub-components specified therein, some of the specified components or sub-components, and/or additional components. For example, a system could include diagnostic component 102, program component 104, input module 310, time stamp component 404 and refresh component 408, or a different combination of these and other components. Sub-components could also be implemented as components communicatively coupled to other components rather than included within parent components. Additionally, it should be noted that one or more components can be combined into a single component providing aggregate functionality. For instance, time stamp component 404 can include refresh component 408, or vice versa, to facilitate recording time of programming, and determining and comparing an elapsed time to a threshold time by way of a single component. The components may also interact with one or more other components not specifically described herein but known by those of skill in the art.

Furthermore, as will be appreciated, various portions of the disclosed systems above and methods below may include or consist of artificial intelligence or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, and in addition to that already described herein, can automate certain mechanisms or processes performed thereby to make portions of the systems and methods more adaptive as well as efficient and intelligent.

In view of the exemplary systems described supra, methodologies that may be implemented in accordance with the disclosed subject matter will be better appreciated with reference to the flow charts of FIGS. 6-9. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to computers. The term article of manufacture, as used, is intended to encompass a computer program accessible from any computer-readable device, conductive carrier interface, or media.

Figure 6:
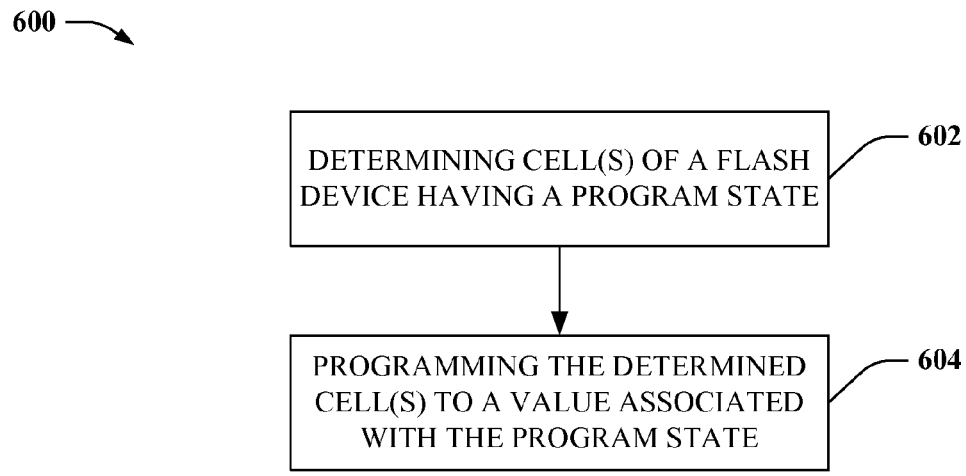
FIG. 6 illustrates a flowchart of an example methodology for providing extended data retention for various types of flash memory.

FIG. 6 illustrates a flowchart of an example methodology for providing extended data retention for flash memory by refreshing data stored in programmed cells of the flash memory without requiring such programmed cells to be erased prior to refresh. Method 600, at 602, can determine a memory cell or group of memory cells (e.g., a page and/or pages) of a flash device that correspond to one or more program states. The program state(s) can be determined, for instance, by measuring a contemporaneous voltage, current and/or charge level, or a combination thereof or of the like, of the memory cell(s). The contemporaneous level(s) can be compared to one or more predetermined default levels associated with the one or more program levels. If a measured cell level of a memory cell is within a threshold range of a predetermined default level corresponding to a particular program state, the memory cell can be assumed to be programmed to that particular program state.

As a particular example to illustrate the foregoing, a quad-bit flash memory can have four different states in half cell, an un-programmed state that corresponds to a memory cell voltage of one volt, a first program state that corresponds to a memory cell voltage of five volts, a second program state that corresponds to a memory cell voltage of nine volts, and a third program state that corresponds to a memory cell voltage of thirteen volts. The corresponding memory cell voltage levels are default levels associated with the states, as described; to determine what program state a cell is in at a given point in time, a voltage (and/or, e.g., current, charge, etc.) of the cell can be measured and compared to the default levels for the quad-bit cell. If the measured cell level is equal to or within a threshold range (e.g., one volt or 1.5 volts, or the like) of one of the default levels, such cell is can thus be in a state (e.g., un-programmed, first program, and so on) that corresponds to the default level. Given the foregoing example, if the measured cell(s) level is six volts and the threshold range is one volt, the measured cell(s) is in a first program state.

It should be appreciated that suitable voltage, charge, and/or current levels can correspond to various memory cell states. For instance, the quad-bit memory cell described in the foregoing example could be in a non-programmed state at thirteen volts, and third program state at one volt. Other suitable associations of cell level(s) and program state(s) are possible as well; such associations involve at least a measurable distinction between default cell levels of program states at least in theoretical circumstances. In addition to the foregoing, the threshold range(s) can be predetermined ranges, or can be determined according to various operating conditions associated with flash memory that can have an effect on data retention, ability to store data, memory cell integrity, or the like. Some examples of operating conditions can include concurrent temperature, supply voltage or other suitable electrical and/or thermal characteristics associated with a memory cell(s), number or frequency of program and/or erase operations, access/read frequency, refresh frequency, or a combination thereof or of the like.

At 604, method 600 can program the memory cell or group of memory cells of the flash device to a default value associated with the program state determined at reference number 602 to refresh the memory cell(s). As a particular non-limiting example, the memory cell(s) can be refreshed by programming the cell directly to the default value. For instance, if a default value corresponds to charge level of five micro-coulombs, the cell(s) can be programmed directly to five micro-coulombs. According to some embodiments, the programming can be done specifically without erasing the cell(s) prior to such programming. As a result, loss in memory cell integrity resulting from a program/erase cycle can be reduced. Accordingly, the subject methodology 600 can provide for extending data retention of flash memory cells by reducing loss in memory cell integrity during data refresh, as well as extending a number of permissible program/erase cycles associated with reading and writing data to the flash memory.

In addition to the foregoing, a substantial benefit is provided over flash design improvements for extending data retention. The design improvements rely on changes to memory cell architecture (e.g., physical changes to the structure, composition, orientation, electrical supply power, or the like or a combination thereof, of memory cell material layers during a design phase of flash memory cells) to improve data retention. Attempts to improve data retention post design were not conducted, partly because of assumptions that memory cell integrity is a physical phenomenon affected most significantly by architecture design. The subject disclosure, however, provides a post-design mechanism to improve data retention and program/erase cycles for flash memory. Thus, aspects of the subject disclosure are applicable not only to newly designed flash memory but to existing flash memory, utilizing a refresh process described herein, providing a substantial benefit to the properties of such devices. Further, unexpected benefits in flash memory data retention and program/erase operations are achieved by implementing the methodologies disclosed herein. Specifically, data retention of 10% or more for various flash memories is achievable. Moreover, it is believed that data retention of 100% or much more in certain circumstances (e.g., for some flash memory architecture under suitable operating conditions, such as temperature, supply power, etc.) can be achieved. As a result, the benefits to data retention are unexpectedly high compared with typical improvements (e.g., a few percent or less) resulting from recent improvements in memory cell architecture (e.g., during flash memory design phase).

Figure 7:
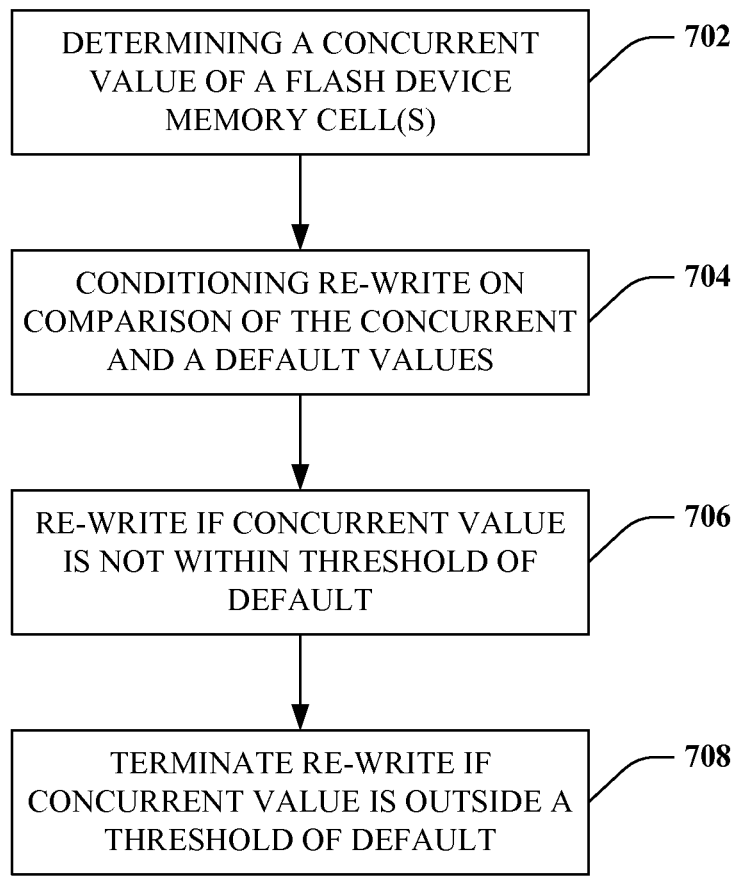
FIG. 7 illustrates a flowchart of a sample methodology for refreshing a program state of a memory cell(s) based on concurrent charge/voltage level.

FIG. 7 illustrates a flowchart of a sample methodology 700 for refreshing a program state of a memory cell(s) based on concurrent charge/voltage level. At 702, method 700 can determine a concurrent value of a flash device memory cell or group of memory cells, as described herein. At 704, method 700 can condition rewriting and/or refreshing the memory cell(s) on a comparison of the concurrent value and a predetermined default value associated with a predetermined state (e.g., non-programmed, programmed, etc.) of the memory cell(s). At 706, as an example of the conditioning performed at reference number 704, method 700 can rewrite and/or refresh the memory cell(s) if the concurrent value is not within a threshold of the default value. Thus if an accuracy/threshold range is 5% and a concurrent value is not within 5% of a default value, for instance, then the concurrent value can be deemed inaccurate and refreshed to the default value.

At 708, as another example of the conditioning performed at reference number 704, method 700 can terminate and/or forego rewriting and/or refreshing the memory cell(s) if the concurrent value is within a threshold range of the default value. The threshold range can be, for instance, an accuracy range that indicates a certain level of accuracy between the concurrent level and the threshold level. As another example, if an accuracy/threshold range is 5%, a concurrent value that is within 5% of a default value can be deemed accurate, and within the threshold range of such default value as specified at reference number 708. It should be appreciated that the articulated example is merely one possible threshold range; any threshold range suitable for determining an acceptable level of accuracy (e.g., defined by a flash memory manufacturer) as compared with a default cell value (e.g., depending on cell value measurement precision, operating conditions, or the like or a combination thereof) are incorporated within the subject disclosure.

Figure 8:
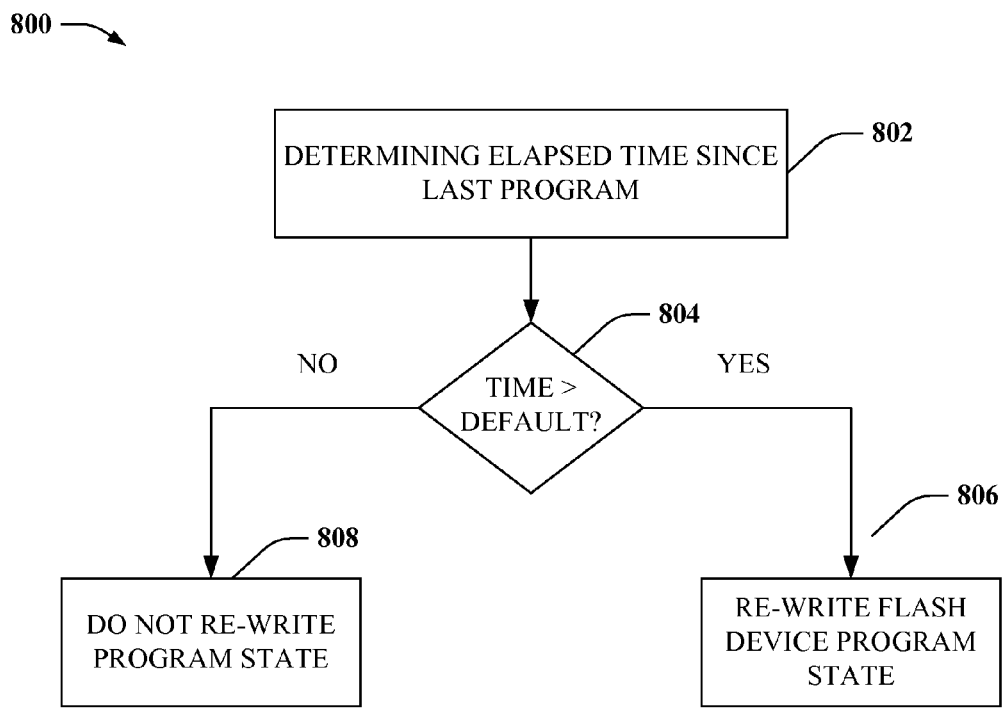
FIG. 8 depicts a flowchart of a sample methodology for periodically refreshing a program state of a memory cell(s).

FIG. 8 depicts a flowchart of a sample methodology 800 for periodically refreshing a program state of a memory cell(s). At 802, method 800 can determine elapsed time since a contemporaneous time and a last time of programming of one or more memory cells of a flash memory device. The elapsed time can be a time since a last refresh operation as described herein (e.g., by reprogramming the cell(s) to a default level associated with a program state) is conducted, a time since data is programmed to such cell(s), or the like. At 804, a determination is made as to whether the elapsed time is greater than a default threshold time. The default threshold time can be established based on operating conditions associated with the flash memory device, and/or program, erase, read, and or write frequency/history associated with the flash memory device, or a combination thereof or of the like. If, at 804, the elapsed time is greater than the default time, method 800 can proceed to 806 where the memory cell(s) of the flash device are rewritten to a default level associated with a program state, as described herein. If, at 804, the elapsed time is determined to be less than the default time, method 800 can proceed to 808 where no rewrite action is performed. Accordingly, method 800 provides for refreshing memory cell data (e.g., without utilizing an erase pulse/operation) in a manner that extends data retention time according to elapsed time since the last program or refresh operation.

Figure 9:
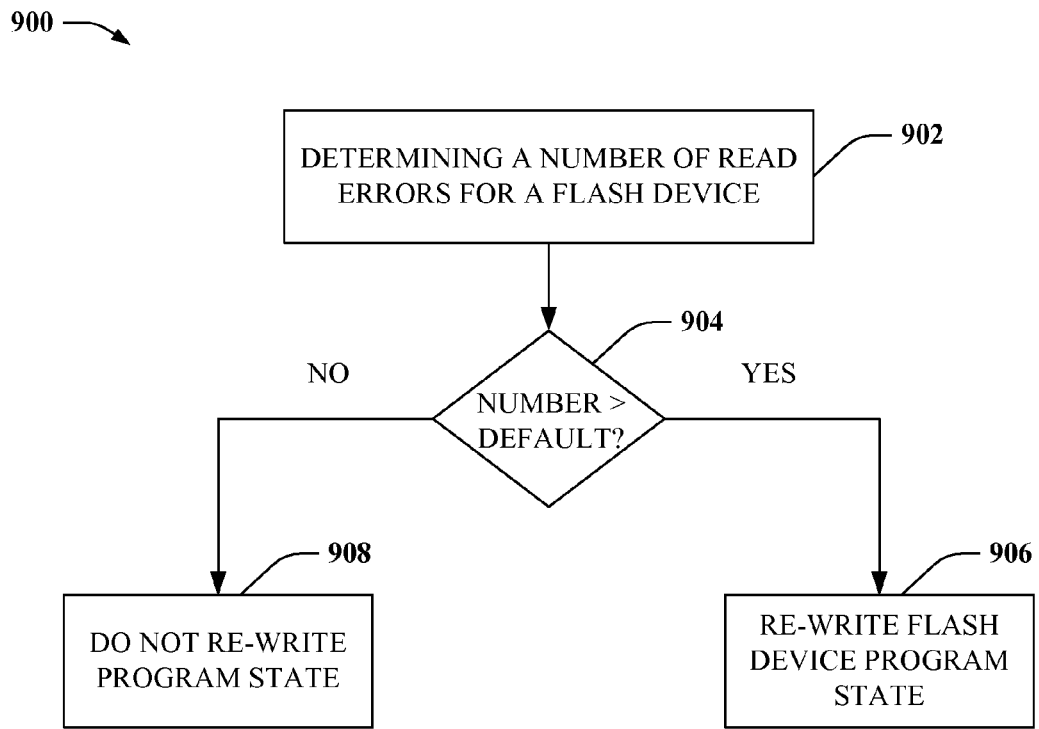
FIG. 9 depicts a flowchart of a sample methodology for refreshing a program state of a memory cell(s) based on read error number and/or frequency.

FIG. 9 depicts a flowchart of a sample methodology for refreshing a program state of a memory cell(s) based on read error number and/or frequency. At 902, method 900 can determine a number and/or frequency of read errors associated with one or more memory cells of a flash memory device, as described herein and/or known in the art. The read errors can be determined with respect to a particular event, such as a predetermined point in time or based on a suitable operation of the flash device pertinent to memory stability (e.g., when power was first supplied to the flash device, when power was last supplied to the flash device, at a particular operating temperature, when the cell or cells were last written to, last refreshed, last programmed, last erased, or a combination thereof or of the like). At 904, method 900 can make a determination as to whether the number of read errors is greater than a default number of read errors (e.g., based on a desired memory cell integrity). If, at 904, the number/frequency of read errors is larger than the default, method 900 can proceed to 906 where the memory cell(s) of the flash device are rewritten to a default level associated with a program state, as described herein. If, at 904, the number/frequency of read errors is not larger than the default, method 900 can proceed to 908 where no rewrite action is performed. As described, method 900 can refresh memory cells of a flash memory device in a manner that improves data retention and/or read/write cycles as a function of a number/frequency of determined read errors associated with such cells/device.

Figure 10:
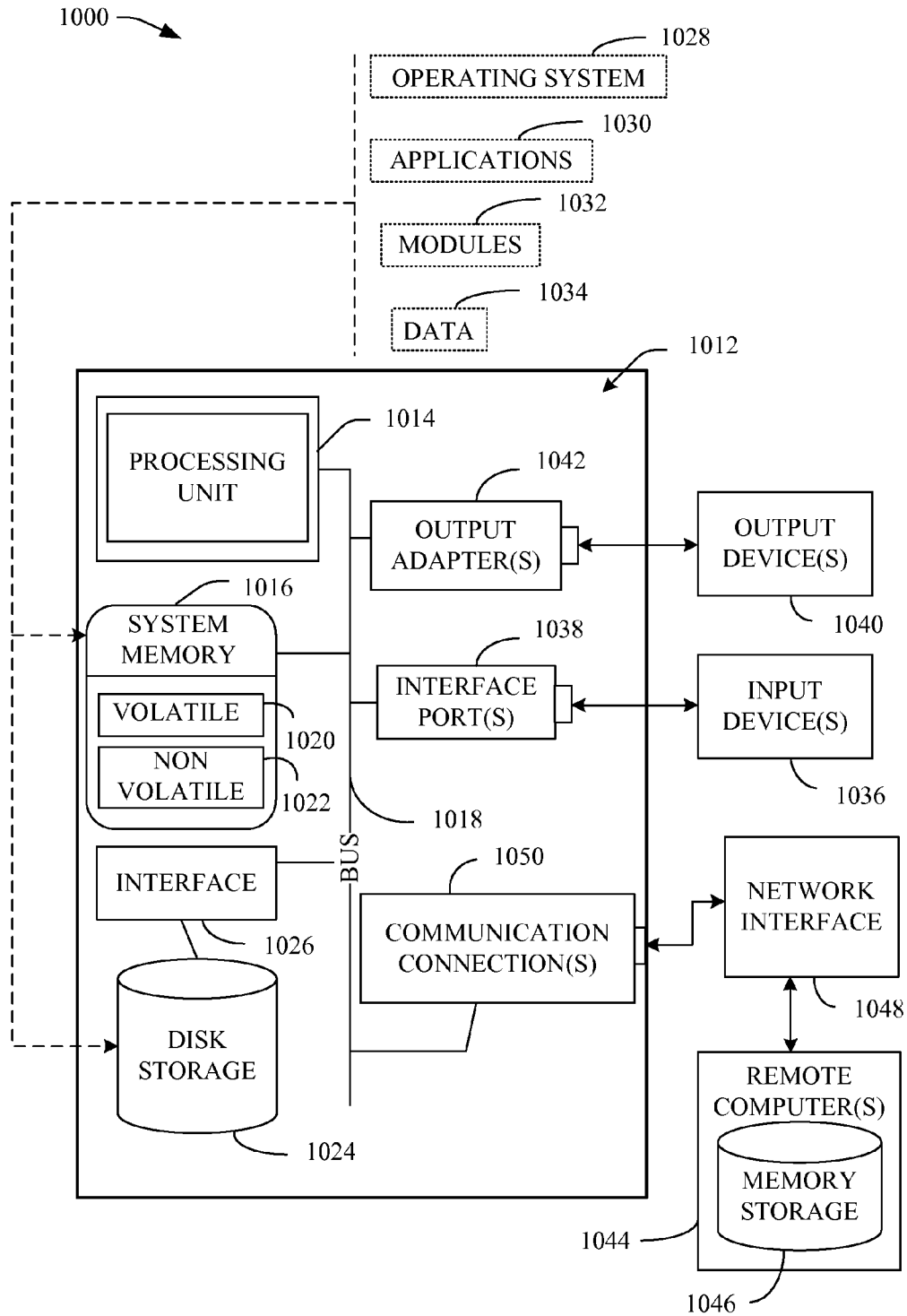
FIG. 10 illustrates a block diagram of an example operating system suitable to implement and/or utilize various aspects of the subject disclosure.
Figure 11:
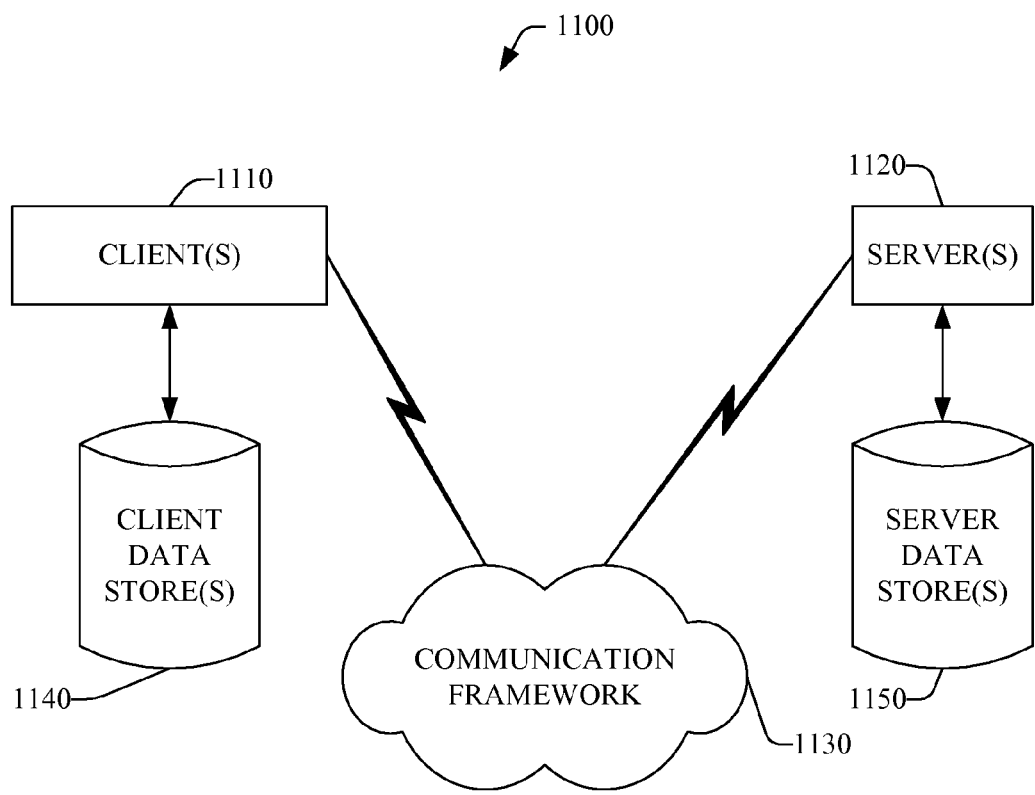
FIG. 11 depicts a block diagram of an example remote communication environment for remote reprogramming of memory cell(s) according to other aspects.

In order to provide additional context for various aspects of the disclosed subject matter, FIGS. 10 and 11 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the invention also may be implemented in combination with other program modules.

Generally, program modules include routines, programs, components, data structures, etc. that can perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects may also be practiced in distributed computing environments where tasks are performed by remote processing devices that are linked through a communications network. However, some, if not all aspects of the invention can be practiced on stand-alone computers. In a distributed computing environment, program modules may be located in both local and remote memory storage devices, described below.

With reference to FIG. 10, an exemplary environment 1010 for implementing various aspects disclosed herein includes a computer 1012 (e.g., desktop, laptop, server, hand held, programmable consumer or industrial electronics . . . ). The computer 1012 includes a processing unit 1014, a system memory 1016, and a system bus 1018. The system bus 1018 can couple system components including, but not limited to, the system memory 1016 to the processing unit 1014. The processing unit 1014 can be any of various microprocessors, such as dual microprocessors, quad microprocessors, and other multiprocessor architectures suitable for a computer environment 1010.

The system bus 1018 can be any of several types of suitable bus structure(s) including the memory bus or memory controller, a peripheral bus or external bus, and/or a local bus using any suitable variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable ROM (EEPROM), or flash memory. Volatile memory 1020 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1012 also includes removable/non-removable, volatile/non-volatile computer storage media. FIG. 10 illustrates, for example, disk storage 1024. Disk storage 1024 includes, but is not limited to, devices such as a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used such as interface 1026.

It is to be appreciated that FIG. 10 describes software that acts as an intermediary between users and the basic computer resources described in operating environment 1010. Such software can include an operating system 1028. Operating system 1028, which can be stored on disk storage 1024, acts to control and allocate resources of the computer system 1012. System applications 1030 take advantage of the management of resources by operating system 1028 through program modules 1032 and program data 1034 stored either in system memory 1016 or on disk storage 1024. It is to be appreciated that the present invention can be implemented with various operating systems or combinations of operating systems.

A user can enter commands or information into the computer 1012 through input device(s) 1036. Input devices 1036 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 can utilize some of the same type of ports as input device(s) 1036. Thus, for example, a USB port may be used to provide input to computer 1012 and to output information from computer 1012 to an output device 1040. Output adapter 1042 is provided to illustrate that there are some output devices 1040 like displays (e.g., flat panel and CRT), speakers, and printers, among other output devices 1040 that require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and can typically include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit-switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems, power modems and DSL modems, ISDN adapters, and Ethernet cards or components.

FIG. 11 is a schematic block diagram of a sample-computing environment 1100 with which the present invention can interact. For instance, measurement of a concurrent state of a flash device and/or application of a program pulse can be conducted by way of a remote client/server interface, or logic associated with conditioning such program pulse on various conditions (e.g., elapsed time, number/frequency of read errors, threshold data loss, or the like) can be conducted via such client/server interface. The system 1100 includes one or more client(s) 1110. The client(s) 1110 can be hardware and/or software (e.g., threads, processes, computing devices). The system 1100 also includes one or more server(s) 1130. Thus, system 1100 can correspond to a two-tier client server model or a multi-tier model (e.g., client, middle tier server, data server), amongst other models. The server(s) 1130 can also be hardware and/or software (e.g., threads, processes, computing devices). The servers 1130 can house threads to perform transformations by employing the present invention, for example. One possible communication between a client 1110 and a server 1130 may be in the form of a data packet adapted to be transmitted between two or more computer processes.

The system 1100 includes a communication framework 1150 that can be employed to facilitate communications between the client(s) 1110 and the server(s) 1130. The client(s) 1110 are operatively connected to one or more client data store(s) 1160 that can be employed to store information local to the client(s) 1110. Similarly, the server(s) 1130 are operatively connected to one or more server data store(s) 1140 that can be employed to store information local to the servers 1130.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has" or "having" are used in either the detailed description or the claims, such terms are intended to be inclusive in a manner similar to the term "comprising" as "comprising" is interpreted when employed as a transitional word in a claim.

What is claimed is:

1. A system that provides extended data retention for a programmed flash memory device, comprising:
    a diagnostic component that determines a particular program state from one or more programmed states of at least one cell of a flash memory device;
    a program component that selectively rewrites the at least one cell to a predetermined value associated with the particular program state from the one or more programmed states in response to a rewrite command, wherein the program component rewrites the at least one cell without first erasing the at least one cell, and wherein the rewrite command specifies the predetermined value and the particular program state for the at least one cell; and
    a refresh component that determines an elapsed time of the at least one cell from a time when the at least one cell is programmed or refreshed, and issues the rewrite command to the program component if the elapsed time is above a threshold refresh time and a command associated with user controlled refreshing of the at least one cell is received from an input module external to the flash memory device, wherein the threshold refresh time is determined based at least in part on an electrical characteristic associated with the at least one cell, and wherein the refresh component suspends the rewrite command in response to receiving another command from the input module external to the flash memory device.

2. The system of claim 1, wherein the program component further comprises at least one of:
    a voltage source that rewrites the at least one cell to the predetermined value by adjusting a voltage of the at least one cell to a predetermined voltage level associated with the particular program state from the one or more programmed states;
    a controller, internal or external to the flash memory device, that one of instructs the flash memory device to measure a concurrent program level of the at least one cell or instructs the flash memory device to rewrite the at least one cell; or
    a current source that rewrites the at least one cell to the predetermined value by adjusting a charge of the at least one cell to a predetermined charge level associated with the particular program state from the one or more programmed states.

3. The system of claim 1, further comprising an evaluation module that determines a concurrent charge, voltage or current value, or a combination thereof, of the at least one cell and compares the concurrent value with a default value of the particular program state from the one or more programmed states.

4. The system of claim 3, the program component conditions rewriting of the at least one cell on whether the concurrent value is within a threshold of the default value.

5. The system of claim 1, wherein the program component is configured to rewrite at least one cell of a multi-level cell to one of a plurality of program state preset values.

6. The system of claim 1, further comprising:
a time stamp component that records the time when the at least one cell of the flash device is programmed or refreshed, or both.

7. The system of claim 1, further comprising:
a memory cell access component that tracks a number or frequency of read errors associated with reading the at least one program cell; and
a memory cell integrity component that issues a rewrite command to the program component if the number or frequency of read errors rises above a predetermined level, causing the program component to rewrite the at least one cell.

8. The system of claim 1, wherein at least one of:
the diagnostic component and program component are incorporated within the flash memory device; or
the diagnostic component or the program component are incorporated within a memory controller or a rewrite component that is at least partially external to the flash memory device.

9. A method for providing extended data retention for programmed flash memory cells, comprising:
determining at least one cell of a flash memory device having one or more program states;
determining an elapsed time between a concurrent time and a time when the at least one cell was last programmed or refreshed, or both;
issuing a rewrite command if the elapsed time is above a threshold rewrite period and a command associated with user controlled refreshing of the at least one cell is received from an application external to the flash memory device, wherein the threshold rewrite period is determined based at least in part on an electrical characteristic associated with the at least one cell;
suspending the rewrite command in response to receiving another command from the application external to the flash memory device; and
programming the at least one cell to a predetermined value associated with a particular program state from the one or more program states in response to the rewrite command, wherein the programming the at least one cell does not first erase the at least one cell, and wherein the rewrite command specifies the predetermined value and the particular program state for the at least one cell.

10. The method of claim 9, further comprising employing an injection of electric charge into the at least one cell in conjunction with programming the at least one cell.

11. The method of claim 9, further comprising employing an injection of holes into the at least one cell in conjunction with programming the at least one cell.

12. The method of claim 9, further comprising determining a concurrent value of the particular program state of the at least one cell prior to programming the at least one cell.

13. The method of claim 12, further comprising conditioning the programming of the at least one cell on a comparison of the determined concurrent value and a default value of the particular program state.

14. The method of claim 12, further comprising foregoing programming the at least one cell if the concurrent value is within a threshold of the default value.

15. The method of claim 12, further comprising executing the programming of the at least one cell if the concurrent value is not within a threshold of the default value.

16. The method of claim 9, further comprising conditioning the programming on receiving the rewrite command from an external diagnostic entity.

17. The method of claim 9, further comprising:
conditioning the programming on a comparison of the elapsed time and the threshold rewrite period.

18. The method of claim 9, further comprising:
determining a number of read errors associated with reading the one or more program states of the at least one cell; and
conditioning the programming on a comparison of the number of read errors and a threshold number of read errors.

19. The method of claim 9, further comprising employing the application external to the flash memory device to execute the programming.

20. A computer program product, comprising:
a non-transitory computer readable medium containing instructions configured to cause a computer or electronic device to extend data retention for programmed flash memory cells, comprising:
a first instruction configured to cause the computer or electronic device to determine at least one cell of a flash memory device in a particular program state from one or more programmed states;
a second instruction configured to cause the computer or electronic device to program the at least one cell to a predetermined value associated with the particular program state from the one or more programmed states in response to a rewrite command, wherein the programming the at least one cell does not first erase the at least one cell, and wherein the rewrite command specifies the predetermined value and the particular program state for the at least one cell; and
a third instruction configured to cause the computer or electronic device to determine an elapsed time between a concurrent time and a time when the at least one cell was last programmed or refreshed, and issue the rewrite command if the elapsed time is above a threshold refresh time and a command associated with user controlled refreshing of the at least one cell is received from an input device external to the flash memory device, wherein the threshold refresh time is determined based at least in part on an electrical characteristic associated with the at least one cell, and wherein the rewrite command is suspended in response to receiving another command from the input device external to the flash memory device.

* * * * *